US010566790B2

(12) United States Patent
Dong et al.

(10) Patent No.: US 10,566,790 B2
(45) Date of Patent: Feb. 18, 2020

(54) METHOD AND DEVICE FOR EXTRACTING SKELETON TOPOLOGY STRUCTURE OF ELECTRIC POWER GRID

(75) Inventors: Jin Dong, Beijing (CN); Jun Luo, Beijing (CN); Xin Jie Lv, Beijing (CN); Hai Rong Lv, Beijing (CN); Qi Ming Tian, Beijing (CN); Wen Jun Yin, Beijing (CN)

(73) Assignee: Utopus Insights, Inc., Valhalla, NY (US)

( * ) Notice: Subject to any disclaimer, the term of this patent is extended or adjusted under 35 U.S.C. 154(b) by 1042 days.

(21) Appl. No.: 14/123,007

(22) PCT Filed: Apr. 16, 2012

(86) PCT No.: PCT/CN2012/074087
§ 371 (c)(1),
(2), (4) Date: Nov. 27, 2013

(87) PCT Pub. No.: WO2012/163187
PCT Pub. Date: Dec. 6, 2012

(65) Prior Publication Data
US 2014/0088894 A1    Mar. 27, 2014

(30) Foreign Application Priority Data
May 27, 2011    (CN) .......................... 2011 1 0140427

(51) Int. Cl.
*H02J 3/00*         (2006.01)
*G01R 21/133*       (2006.01)
(52) U.S. Cl.
CPC .............. *H02J 3/00* (2013.01); *G01R 21/133* (2013.01); *H02J 2003/007* (2013.01); *Y02E 60/76* (2013.01); *Y04S 40/22* (2013.01)
(58) Field of Classification Search
CPC .................................................. G01R 21/133
See application file for complete search history.

(56) References Cited

U.S. PATENT DOCUMENTS

| 6,516,326 B1* | 2/2003 | Goodrich .......... G06F 17/30566 |
| | | 707/602 |
| 2009/0281674 A1* | 11/2009 | Taft ........................ G01D 4/002 |
| | | 700/286 |

(Continued)

FOREIGN PATENT DOCUMENTS

| CN | 1763782 A | 4/2006 |
| CN | 101794410 A | 8/2010 |

(Continued)

OTHER PUBLICATIONS

"The Application of the Electric Power Network Topology for the Matrix Methodology", Inner Mongolia Electric Power, Apr. 18, 2000.

(Continued)

*Primary Examiner* — John E Breene
*Assistant Examiner* — Jeffrey C Morgan
(74) *Attorney, Agent, or Firm* — Ahmann Kloke LLP

(57) ABSTRACT

A system and method for extracting a skeleton topology structure for an electric power grid, the method comprising: receiving a description of a topology sub-structure corresponding with user's need and a description of skeleton topology sub-structure extracted from the topology sub-structure; generating a first incidence matrix based on the description of the topology sub-structure and a second incidence matrix based on the description of the skeleton topology sub-structure; generating a third incidence matrix based on a primary topology structure of electric power grid; searching from the third incidence matrix a sub-matrix that matches the first incidence matrix; obtaining a fourth incidence matrix by using the second incidence matrix to transform the matching sub-matrix; and generating a skeleton topology structure corresponding to the primary topology structure based on the fourth incidence matrix.

15 Claims, 8 Drawing Sheets

(56) References Cited

U.S. PATENT DOCUMENTS

| | | | |
|---|---|---|---|
| 2010/0152910 A1 | 6/2010 | Taft | |
| 2011/0029147 A1* | 2/2011 | Sun | G06Q 10/06 700/295 |
| 2011/0041066 A1* | 2/2011 | Kimmet | G06F 8/61 715/736 |
| 2013/0173667 A1* | 7/2013 | Soderberg | G06T 11/206 707/798 |

FOREIGN PATENT DOCUMENTS

| | | |
|---|---|---|
| CN | 101499658 B | 11/2010 |
| CN | 101938124 A | 1/2011 |
| DE | 10120081 | 11/2002 |
| JP | 06-086466 A | 3/1994 |
| JP | 09-327128 A | 12/1997 |
| JP | 11-282525 A | 10/1999 |
| JP | 2004014205 | 1/2004 |
| JP | 2007-097255 A | 4/2007 |

OTHER PUBLICATIONS

Yubao et al., "Research and Application of Web Topology Structure Extraction Technology", Computing Engineering, vol. 32, No. 1, Jan. 2006, with English language AbstractUBAO.

Qiang et al., "Power System Dispatching Order Generating System With Calculation and Analysis Functions," Power System Technology, vol. 29, No. 7, Apr. 2005.

Chunli Li, "Extract Features of Distribution Network Topology and Research Network Analysis Based on GIS," dissertation published by Huazhong University of Science and Technology, May 1, 2006, English language Abstract found on p. 3.

Wang et al., "Generating Statistically Correct Random Topologies for Testing Smart Grid Communication and Control Networks," IEEE Transactions on Smart Grid, vol. 1, No. 1, Jun. 2010, pp. 28-39.

Wang et al., "Topology Identification of Power Network Based on Incidence Matrix," Power System Technology, vol. 25, No. 2, Feb. 2001.

Wang et al., "Generating Statistically Correct Random Topologies for Testing Smart Grid Communication and Control Networks", IEEE Transactions on Smart Grid, Feb. 2010.

Blumsack, "Network Topologies and Transmission Investment Under Electrical-Industry Restructuring", Carnegie Mellon University, Carnegie Institute of Technology, Thesis, May 2006.

Hines et al., "The Topological and Electrical Structure of Power Grids", 43rd Hawaii International International Conference on Systems Science (HICSS-43 2010), Proceedings, Jan. 5-8, 2010, Koloa, Kauai, HI, USA.

International Search Report PCT/CN2012/074087.

* cited by examiner

METHOD AND DEVICE FOR EXTRACTING SKELETON TOPOLOGY STRUCTURE OF ELECTRIC POWER GRID

CROSS-REFERENCE TO RELATED APPLICATIONS

The present invention relates to and claims the benefit of the filing date of commonly-owned, PCT Patent Application No. PCT/CN2012/074087, filed Apr. 16, 2012, which further claims the benefit of priority date of commonly-owned, co-pending Chinese Patent Application No. CN 201110140427.8, filed on May 27, 2011, the entire contents and disclosure of which is incorporated by reference as if fully set forth herein.

TECHNICAL FIELD

The present invention generally relates to an electric power grid, and more specifically to a method and device for extracting skeleton topology structure of the electric power grid.

DESCRIPTION OF THE RELATED ART

An electric power system as a whole consists of electric components connected in a certain form, such as generators, transformers, buses, switches, disconnector, and lines. Performance of its electric function is restricted by component characteristics and connecting relations of the components. With regardless of physical component characteristics of the grid, the electric power system can be abstracted as a grid topology formed by branches and nodes connected by the branches. Considering the restrictions of component characteristics and their connecting relations, an electric power grid actually includes two types of topology structures: geometry topology and physical topology. The geometry topology represents the geometrical connecting status of grid devices, while the physical topology represents the physical electric coupling relations of grid components.

Analysis of grid topology structure of an electric power system is usually conducted in the following two aspects. The first aspect lies in establishing of the grid topology structure. According to the status of switches, the grid connected by various devices can be indicated by a matrix of connecting relations of branches and nodes, which can be used for analyzing and computing the power system. Also, identification of inter-connected individual sub-device is the ground for physical analyzing, computing and studying of the electric power system. The second aspect lies in studying and utilizing the grid topology structure to excavating the internal relations between its topology structure and physical functions, so as to make it more convenient and easier for analyzing and controlling the electric power system. In actual operation, different business departments of an electric power grid company need to make analysis and computing of the electric power system according to their own business needs. Thereby, different points of concerns to primary topology structure of the electric power system are focused on abstracting different skeleton topology networks from a primary topology structure. Currently, the business departments of the electric power grid company mainly extracts skeleton topology structure from the primary topology structure manually according to their business needs and based on experience of experts. However, there are actually a huge number of components within an electric power system and the lines are heavy and complicated. For reasons such as load changes, equipment maintenance and active optimizations, the grid is continuously renovated at the equipment level, and the primary topology structure is often changed. If the business departments extract and maintain skeleton topology structure from the primary topology structure manually, the working procedures would be overloaded with details and the costs would be high.

Therefore, it is necessary to provide a method for automatic and efficient extracting skeleton topology structure according to operational needs.

SUMMARY OF THE INVENTION

In order to solve these problems, this invention provides an automatic and efficient method and device for extracting skeleton topology structure.

According to one aspect of the invention, a method for extracting a skeleton topology structure of an electric power grid is provided. The method comprises: receiving a description of a topology sub-structure corresponding with user's need and a description of a skeleton topology sub-structure extracted from the topology sub-structure; generating a first incidence matrix based on the description of the topology sub-structure and generating a second incidence matrix based on the description of the skeleton topology sub-structure; generating a third incidence matrix based on a primary topology structure of electric power grid; searching from the third incidence matrix a sub-matrix that matches the first incidence matrix; obtaining a fourth incidence matrix by using the second incidence matrix to transform the matching sub-matrix; and generating a skeleton topology structure corresponding to the primary topology structure based on the fourth incidence matrix.

According to a second aspect of the invention, a device for extracting a skeleton topology structure of an electric power grid is provided. The device comprises: a receiving module configured to receive a description of a topology sub-structure corresponding with user's need and a description of a skeleton topology sub-structure extracted from the topology sub-structure; an incidence matrix generating module configured to generate a first incidence matrix based on the description of the topology sub-structure, to generate a second incidence matrix based on the description of the skeleton topology sub-structure, and to generate a third incidence matrix based on a primary topology structure of electric power grid; a searching module configured to search from the third incidence matrix a sub-matrix that matches the first incidence matrix; a matrix transforming module configured to obtain a fourth incidence matrix by using the second incidence matrix to transform the matching sub-matrix; and a skeleton topology structure generating module configured to generate a skeleton topology structure corresponding to the primary topology structure according to the fourth incidence matrix.

The method and device for extracting skeleton topology structure according to this invention can automatically and efficiently extract skeleton topology structure according to business needs.

BRIEF DESCRIPTION OF THE DRAWINGS

In combination with the drawings and in reference to the following detailed descriptions of exemplified embodiments, the invention itself, preferred embodiments, objectives and advantages of this invention can be better understood.

DETAILED DESCRIPTION OF THE PREFERRED EMBODIMENT

In the following discussion, the method and device for extracting a skeleton topology structure of an electric power grid according to the embodiments of this invention will be described in combination with the attached drawings, so that objectives and advantages of this invention can be better understood.

Figure 1:
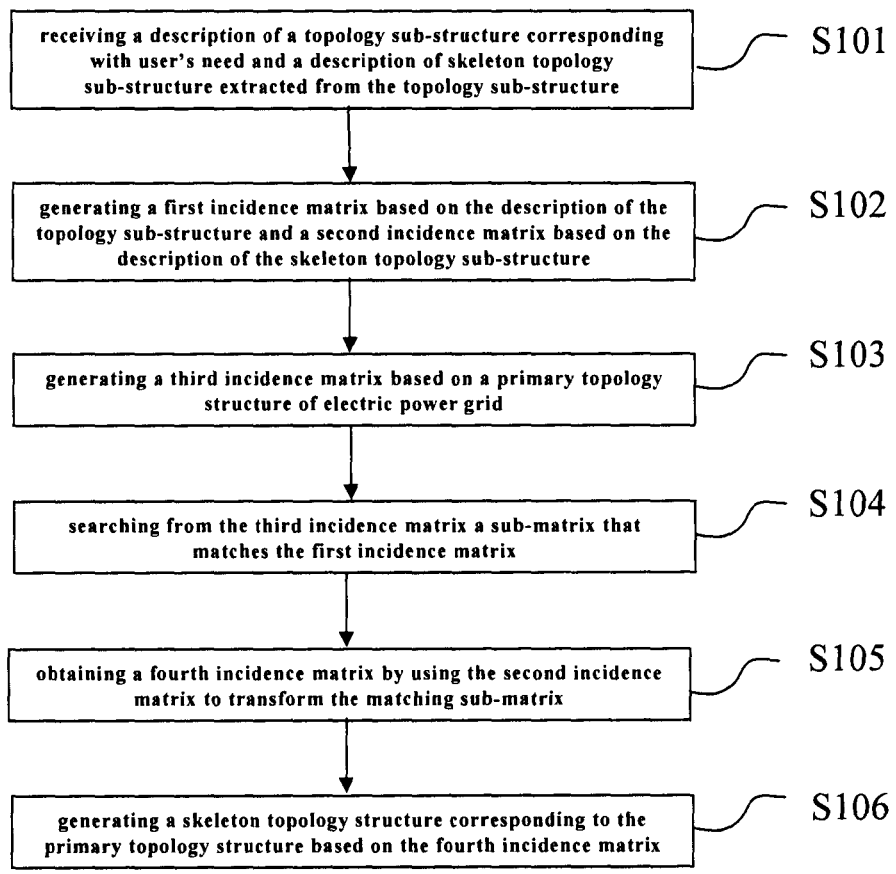
FIG. 1 shows the method for extracting a skeleton topology of the electric power grid according to an embodiment of this invention.

FIG. 1 shows a method for extracting a skeleton topology of the electric power grid according to an embodiment of this invention. The method comprises: in Step S101, receiving descriptions of a topology sub-structure corresponding with user's need and receiving descriptions of skeleton topology sub-structure extracted from the topology sub-structure; in Step S102, generating a first incidence matrix based on descriptions of the topology sub-structure and generating a second incidence matrix based on descriptions of the skeleton topology sub-structure; in Step S103, generating a third incidence matrix based on a primary topology structure of the electric power grid; in Step S104, searching from the third incidence matrix a sub-matrix that matches the first incidence matrix; in Step S105, generating a fourth incidence matrix by using the second incidence matrix to transform the matching sub-matrix; in Step S106, generating skeleton topology structure corresponding to the primary topology structure according to the fourth incidence matrix.

In step S101, a description of a topology sub-structure that corresponds with the need of user and a description of a skeleton topology sub-structure extracted from the topology sub-structure are received. Because different business departments of an electric power company have different business needs and different business analysis objectives, their points of concerns are different even for a same primary topology structure of electric power grid. Thereby, different business departments need to specify topology substructures that correspond with their business needs, and specify skeleton topology substructures extracted from the topology substructures. With regards to a primary topology structure of a whole electric power system, the topology substructure is subset of the primary topology structure, and the skeleton topology sub-structure is further simplification of the topology substructure, which is made by the departments according to their business needs. According to an embodiment of this invention, the user is not only provided with an editing tool with graphic interface so that the user can edit topology structures concerned personally, but also can select a topology substructure concerned from a primary topology structure and make further simplification to the topology sub-structure to form a skeleton topology substructure. According to another embodiment of this invention, files containing topology substructures and skeleton topology substructures edited by the user can be imported.

In step S102, a first incidence matrix is generated based on the description of the topology sub-structure, and a second incidence matrix is generated based on the description of the skeleton topology sub-structure, in which the first incidence matrix corresponds to the incidence matrix of the topology sub-structure and the second incidence matrix corresponds to the incidence matrix of the skeleton topology sub-structure. In the field of electric power transmission, the incidence matrix can be used to describe an incidence relationship between the connections among electric components and the electric components within a topology structure of the electric power grid. Specifically, the primary topology structure of an electric power grid connecting various devices can be abstracted as a directed graph of the connecting relations of nodes-branches, in which the nodes indicate the electric components while the branches indicate the connections of the electric components. A topology structure of an electric power grid with n nodes and b branches can be indicated by an n×b matrix. Row vectors of the matrix correspond to the nodes while column vectors of the matrix correspond to the branches of the electric power grid. Vector $a_{ij}$ the matrix is defined as:

$$a_{ij} = \begin{cases} 0 (\text{when branch } k \text{ is not connected to node } j); \\ 1 \begin{pmatrix} \text{when branch } k \text{ is connected to node } j \\ \text{in the direction that the current flows out from node } j \end{pmatrix}; \\ -1 \begin{pmatrix} \text{when branch } k \text{ is connected to node } j \\ \text{in the direction that the current flows into node } j \end{pmatrix} \end{cases}$$

Each column of the incidence matrix corresponds to a branch, every branch must connect two nodes, and the directions are one inward and the other outward. Thus, every column contains only two nonzero elements, +1 and −1. If summing elements of all rows by columns, a row with each element as zero would be obtained. Thereby, the rows of a matrix are not independent to each other. For elements of any of the rows, they can be obtained by summing all rows other than this row and changing the signs of the sum. Taking the topology substructure in FIG. 2 as an example to describe the generation of corresponding incidence matrix, the first step is to abstract the topology substructure in FIG. 2 to form the directed graph of the connecting relations of nodes-branches. It can be seen from the directed graph that the connection between node 1 and node 3 is disconnector 1, the connection between node 2 and node 4 is disconnector 2, the connection between node 3 and node 5 is ground disconnector 1, the connection between node 4 and node 5 is ground disconnector 2, the connection between node 3 and node 4 is breaker 1. A row vector V includes bus segment 1, bus segment 2, dummy point 3, dummy point 4, dummy point 5. A column vector M includes disconnector 1, disconnector 2, breaker 1, ground disconnector 1, ground disconnector 2. According to the above description of the incidence matrix, an incidence matrix A=V×M corresponding to the topology substructure is obtained.

$$\text{Row vector } V = \begin{bmatrix} \text{Bus segment 1} \\ \text{Bus segment 2} \\ \text{Dummy point 3} \\ \text{Dummy point 4} \\ \text{Dummy point 5} \end{bmatrix}_{5*1}$$

$$\text{Column vector } M = \begin{bmatrix} \text{Disconnector 1} \\ \text{Disconnector 2} \\ \text{Breaker 1} \\ \text{Ground disconnector 1} \\ \text{Ground disconnector 2} \end{bmatrix}^T_{5*1}$$

$$\text{Incidence matrix } A = \begin{bmatrix} 1 & 0 & 0 & 0 & 0 \\ 0 & 1 & 0 & 0 & 0 \\ -1 & 0 & 1 & 1 & 0 \\ 0 & -1 & -1 & 0 & 1 \\ 0 & 0 & 0 & -1 & -1 \end{bmatrix}_{5*5}$$

Figure 2:
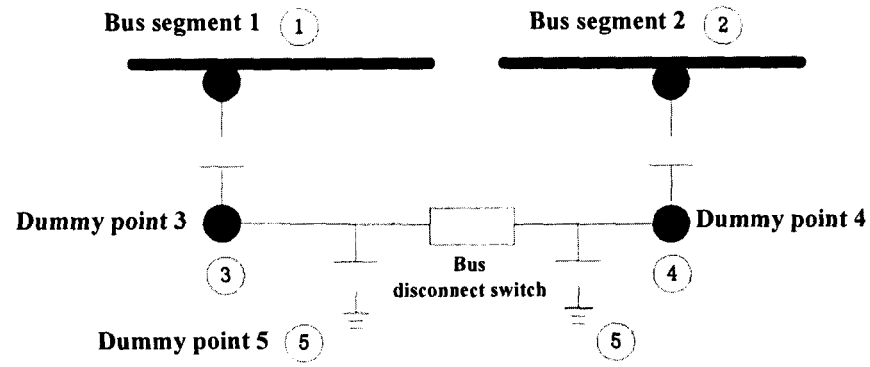
FIG. 2 shows a diagram of the topology substructure, according to an embodiment of this invention.
Figure 3:
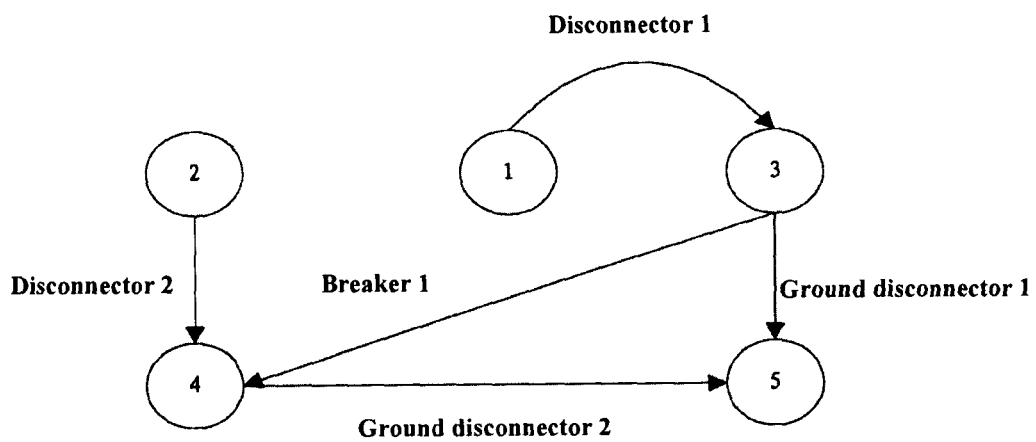
FIG. 3 shows a directed graph of the connecting relations of nodes-branches formed by abstracting the topology sub-structure in FIG. 2, according to an embodiment of this invention.
Figure 4:
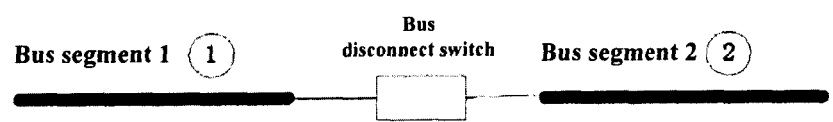
FIG. 4 shows diagram of the skeleton topology substructure, according to an embodiment of this invention.
Figure 5:
FIG. 5 shows a directed graph of the connecting relations of nodes-branches formed by abstracting the skeleton topology substructure in FIG. 4, according to an embodiment of this invention.

Again taking the topology substructure in FIG. 2 as an example, because the user is a dispatch department of electric power system, more concerns are given to the status of buses and switches, the skeleton topology substructure extracted according to user needs only include buses and switches. FIG. 4 shows the skeleton topology substructure according to an embodiment of this invention. FIG. 5 shows a directed graph of the connecting relations of nodes-branches formed by abstracting the skeleton topology substructure in FIG. 4, according to an embodiment of this invention. With the method of generating the incidence matrix, an incidence matrix A' corresponding to the skeleton topology substructure is obtained.

$$\text{Incidence matrix } A' = \begin{bmatrix} 0 & 0 & 1 & 0 & 0 \\ 0 & 0 & -1 & 0 & 0 \\ 0 & 0 & 0 & 0 & 0 \\ 0 & 0 & 0 & 0 & 0 \\ 0 & 0 & 0 & 0 & 0 \end{bmatrix}_{5*5}$$

In step S103, a third incidence matrix is generated based on a primary topology structure of the electric power grid, in which the third incidence matrix corresponds to the incidence matrix of the primary topology structure. The primary topology structure of the electric power grid corresponds to the electric power grid as a target of analysis.

Figure 6:
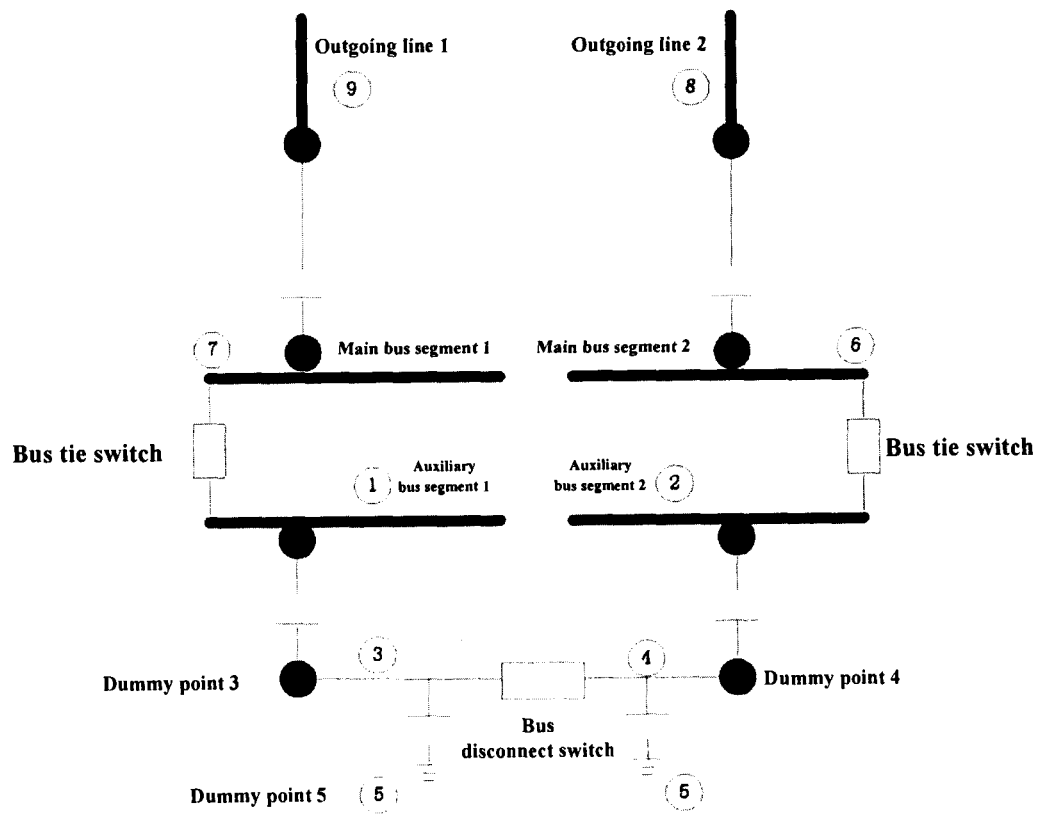
FIG. 6 shows diagram of the primary topology structure, according to an embodiment of this invention.
Figure 7:
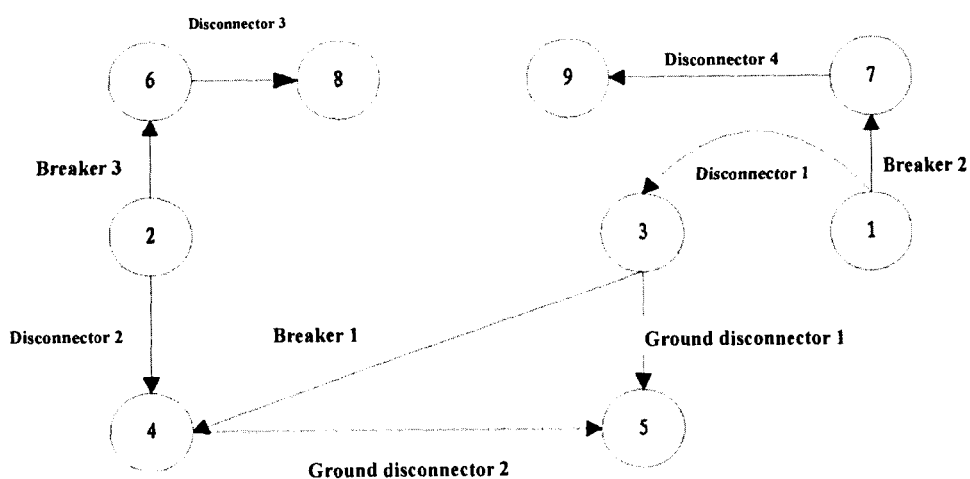
FIG. 7 shows a directed graph of the connecting relations of nodes-branches formed by abstracting the topology sub-structure in FIG. 6, according to an embodiment of this invention.

Generally, the electric power grid, as a target of analysis, covers a city or a district. A city-level medium electric transmission system has about 400 lines, 120 substations. Each substation has about 500 primary devices and each line has about 50 primary devices. Major devices include: main transformers, switches, breakers, buses, lines, current transformers, voltage transformers, reactors and ground disconnector. That means the primary topology structure of corresponding electric power grid has complicated lines and numerous electric components. Based on the above description of the incidence matrix, the incidence matrix of primary topology structure is generated according to the primary topology structure of the electric power grid. To make it convenient for descriptions, a simple primary topology structure is schematically selected in an embodiment of this invention. FIG. 6 shows a diagram of the primary topology structure, according to an embodiment of this invention. By abstracting the topology substructure in FIG. 6, the directed graph of the connecting relations of nodes-branches in FIG. 7 is formed. The row vector V' includes auxiliary bus segment 1, auxiliary bus segment 2, dummy point 3, dummy point 4, dummy point 5, main bus segment 2, main bus segment 1, outgoing line 2, outgoing line 1. The column vector M' includes disconnector 1, disconnector 2, breaker 1, ground disconnector 1, ground disconnector 2, breaker 2, breaker 3, disconnector 3, disconnector 4. Then according to the description of the incidence matrix, the incidence matrix A"=V'×M' corresponding to the primary topology structure is obtained.

$$\text{Row vector } V' = \begin{bmatrix} \text{Auxiliary bus segment 1} \\ \text{Auxiliary bus segment 2} \\ \text{Dummy point 3} \\ \text{Dummy point 4} \\ \text{Dummy point 5} \\ \text{Main bus segment 2} \\ \text{Main bus segment 1} \\ \text{Outgoing line 2} \\ \text{Outgoing line 1} \end{bmatrix}_{9*1}$$

$$\text{Column vector } M' = \begin{bmatrix} \text{Disconnector 1} \\ \text{Disconnector 2} \\ \text{Breaker 1} \\ \text{Ground disconnector 1} \\ \text{Ground disconnector 2} \\ \text{Breaker 2} \\ \text{Breaker 3} \\ \text{Disconnector 3} \\ \text{Disconnector 4} \end{bmatrix}^T_{9*1}$$

$$\text{Incidence matrix } A'' = \begin{bmatrix} 1 & 0 & 0 & 0 & 0 & 1 & 0 & 0 & 0 \\ 0 & 1 & 0 & 0 & 0 & 0 & 1 & 0 & 0 \\ -1 & 0 & 1 & 1 & 0 & 0 & 0 & 0 & 0 \\ 0 & -1 & -1 & 0 & 1 & 0 & 0 & 0 & 0 \\ 0 & 0 & 0 & -1 & -1 & 0 & 0 & 0 & 0 \\ 0 & 0 & 0 & 0 & 0 & 0 & -1 & 1 & 0 \\ 0 & 0 & 0 & 0 & 0 & -1 & 0 & 0 & 1 \\ 0 & 0 & 0 & 0 & 0 & 0 & 0 & -1 & 0 \\ 0 & 0 & 0 & 0 & 0 & 0 & 0 & 0 & 1 \end{bmatrix}_{9*9}$$

Figure 8:
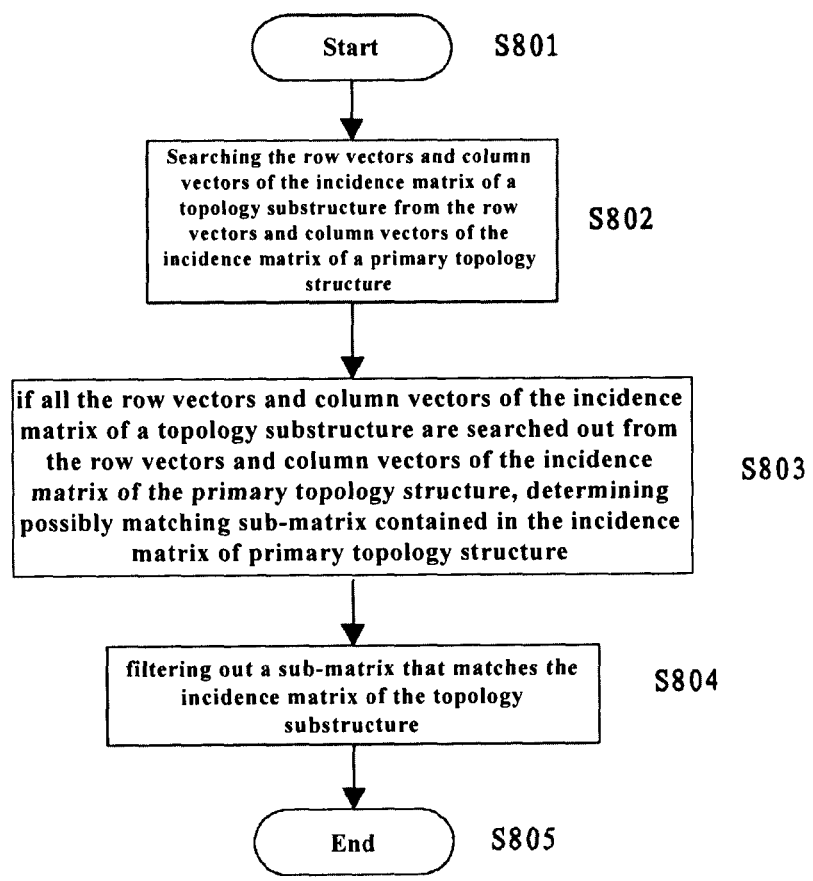
FIG. 8 shows a flow chart of searching an incidence matrix of the topology substructure within the incidence matrix of a primary topology structure of the electric power grid.
Figure 9:
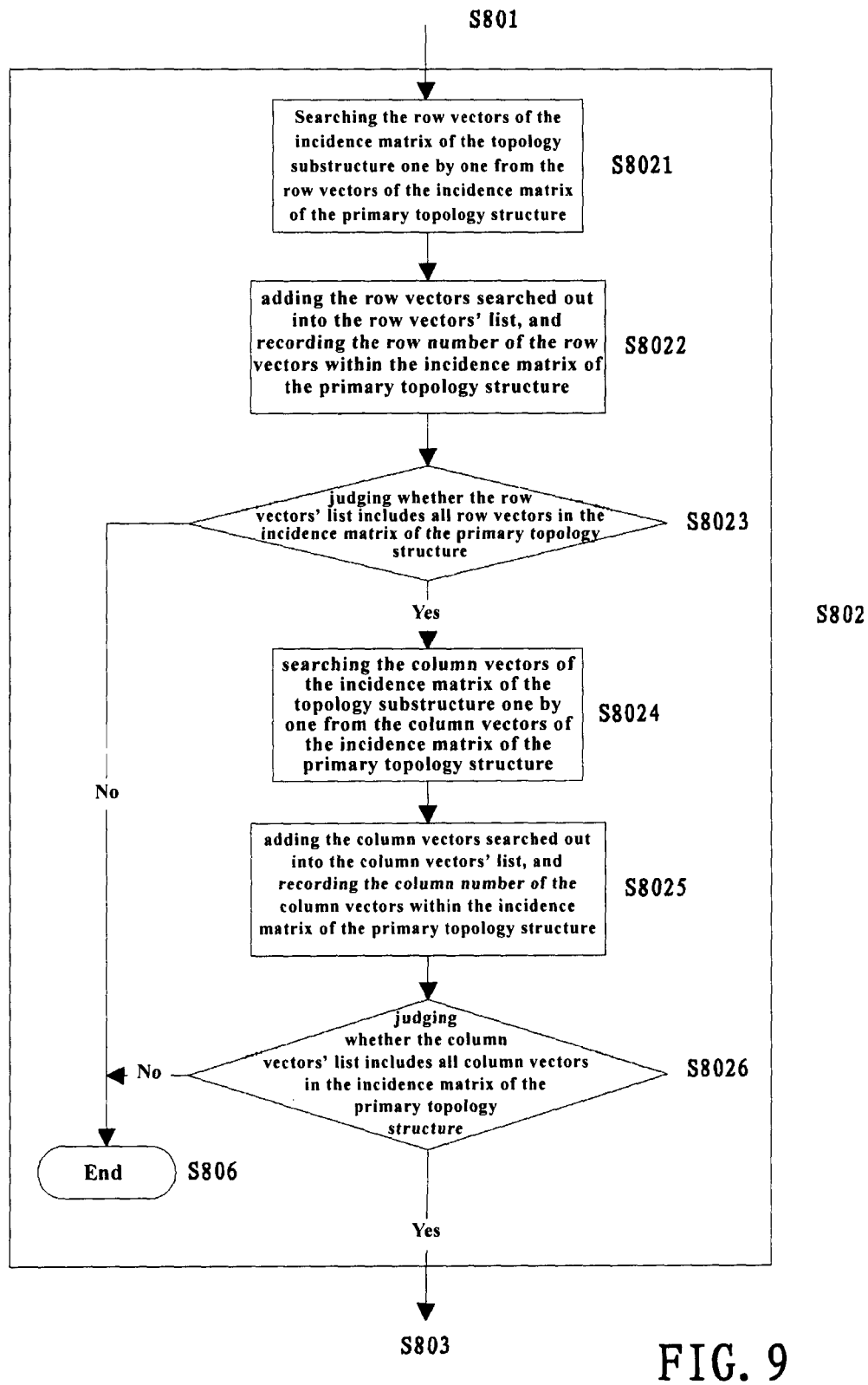
FIG. 9 shows a specific process for implementing Step S802 in FIG. 8.
Figure 10:
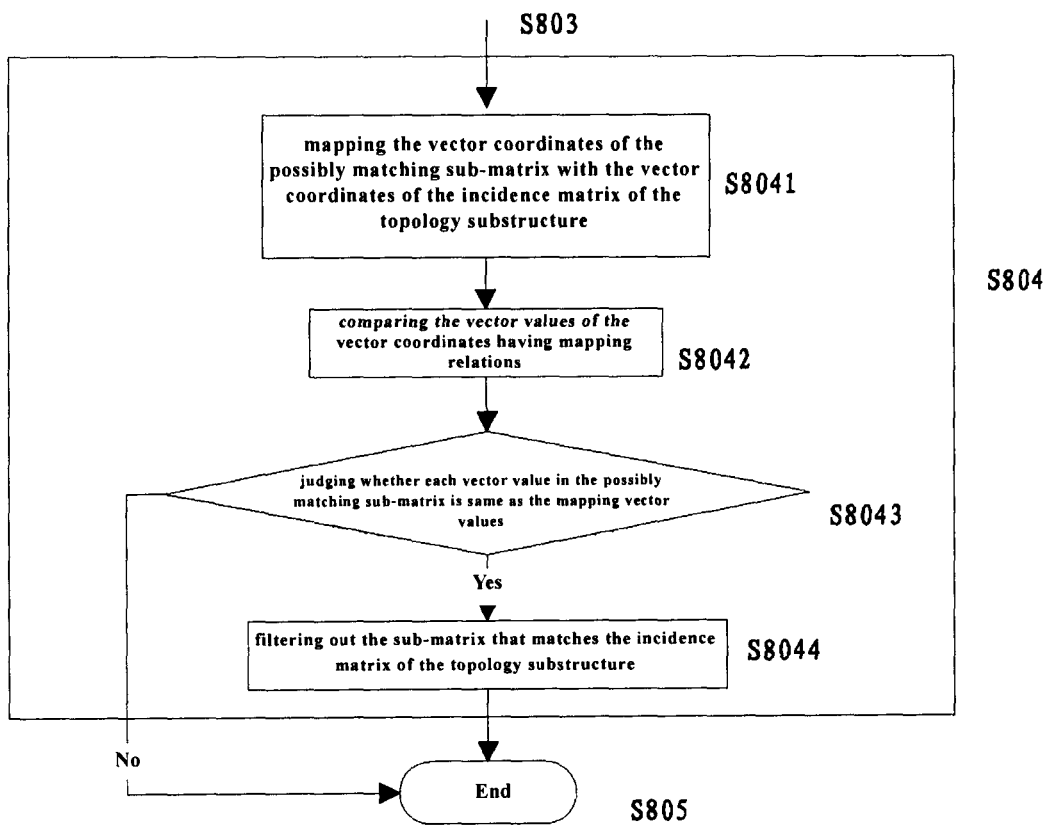
FIG. 10 shows a specific process for implementing Step S804 in FIG. 8.

In step S104, a sub-matrix that matches the first incidence matrix is searched from the third incidence matrix, that is, a sub-matrix that matches the incidence matrix of a topology substructure is searched from the incidence matrix of a primary topology structure of the power grid. FIG. 8 shows a flow chart of searching an incidence matrix of the topology substructure from the incidence matrix of a primary topology structure of the electric power grid. Specifically, the flow starts from Step S801. In step S802, the row vectors and column vectors of the incidence matrix of a topology substructure is searched from the row vectors and column vectors of the incidence matrix of a primary topology structure, respectively. Specifically, FIG. 9 shows the specific process for implementing Step S802 in FIG. 8. In step S8021, the row vectors of the incidence matrix of a topology substructure are searched one by one from the row vectors of the incidence matrix of a primary topology structure. In step S8022, the row vectors searched out are added into the row vectors' list, and the row numbers of the row vectors within the incidence matrix of the primary topology structure is recorded. In step S8023, it is judged whether the row vectors' list includes all row vectors in the incidence matrix of the primary topology structure. If result of the judgment is no, the flow ends; if result of the judgment is yes, the flow proceeds to Step S8024, in which the column vectors of the incidence matrix of a topology substructure is searched one by one from the column vectors of the incidence matrix of a primary topology structure. In Step S8025, the column vectors searched out are added into the column vectors' list, and the column numbers of the column vectors within the incidence matrix of the primary topology structure is recorded. In step S8026, it is judged whether the column vectors' list includes all column vectors in the incidence matrix of the primary topology structure. If result of the judgment is no, the flow ends; if result of the judgment is yes, the flow proceeds to Step S803 in FIG. 8. Those skilled in the art will appreciate that when searching the row vectors and column vectors of the incidence matrix of a topology substructure from the row vectors and column vectors of the incidence matrix of a primary topology structure, the sequence is not invariable. It is also possible to search column vectors of the incidence matrix of a topology substructure first, and then search the row vectors of the incidence matrix of a topology substructure after making sure that all the column vectors of the incidence matrix of a topology substructure are searched out. In this way, objective of this invention can also be achieved. In Step S803, if all the row vectors and column vectors of the incidence matrix of a topology substructure are searched out from the row vectors and column vectors of the incidence matrix of a primary topology structure, it is determined that possibly matching sub-matrix contained in the incidence matrix of primary topology structure. By referring to the row vectors and column vectors of the incidence matrix of a topology substructure, the row vectors and column vectors searched out are permutated and combined, possibly matching sub-matrix contained in the incidence matrix of primary topology structure can be determined. In Step S804, a sub-matrix that matches the incidence matrix of the topology substructure is filtered out from the possibly matching sub-matrix contained in the incidence matrix of primary topology structure. FIG. 10 shows a specific process for implementing Step S804 in FIG. 8. In Step S8041, the vector coordinates of the possibly matching sub-matrix are mapped with the vector coordinates of the incidence matrix of the topology substructure. In step S8042, the vector values of the vector coordinates of the possibly matching sub-matrix is compared with the vector values of the vector coordinates of the incidence matrix of the topology substructure having mapping relations. In step S8043, it is judged whether each vector value in the possibly matching sub-matrix is same as the mapping vector values. If result of the judgment is no, then the flow proceeds to Step S805 and ends. If result of the judgment is yes, then the flow proceeds to Step S8044, in which the sub-matrix that matches the incidence matrix of the topology substructure is filtered out, and the flow ends.

According to the above embodiment of this invention, the incidence matrix A of a topology substructure is searched from the incidence matrix A" of a primary topology structure. With the searching method, the row vectors V of the incidence matrix A of the topology substructure is searched out one by one from the row vectors V' of the incidence matrix A". That is, the buses and dummy points are searched from row vectors V' of the incidence matrix A". Because both auxiliary buses and main buses are buses, the row vectors searched out include auxiliary bus segment 1, auxiliary bus segment 2, dummy point 3, dummy point 4, dummy point 5, main bus segment 2, main bus segment 1. The row vectors searched out are added into the row vectors' list as indicated in Table 1, and the row number of the row vectors searched out within the incidence matrix of the primary topology structure is recorded. At this moment, it is judged that the row vectors list includes all row vectors of the incidence matrix of the topology substructure. Thus, the column vectors M of the incidence matrix of the topology substructure is searched out one by one from the column vectors M" of the incidence matrix of the primary topology structure. That is, the disconnector, breakers and ground disconnector are searched from the column vectors M" of the incidence matrix of the primary topology structure. The column vectors searched out include disconnector 1, disconnector 2, breaker 1, ground disconnector 1, ground disconnector 2, breaker 2, breaker 3, disconnector 3, and disconnector 4. The column vectors searched out are added into the column vectors' list as indicated in Table 2, and the column number of the column vectors searched out within the incidence matrix of the primary topology structure is recorded. At this moment, it is judged that the column vectors list includes all column vectors of the incidence matrix of the topology substructure.

TABLE 1

Row vectors' list

| Row Vectors searched out | Row No. |
| --- | --- |
| auxiliary bus segment 1 | 1 |
| auxiliary bus segment 2 | 2 |
| main bus segment 1 | 7 |
| main bus segment 2 | 6 |
| dummy point 3 | 3 |
| dummy point 4 | 4 |
| dummy point 5 | 5 |

TABLE 2

Column vectors' list

| Column Vectors searched out | Column No. |
| --- | --- |
| disconnector 1 | 1 |
| disconnector 2 | 2 |
| disconnector 3 | 7 |
| disconnector 4 | 6 |
| breaker 1 | 3 |

TABLE 2-continued

| Column vectors' list | |
|---|---|
| Column Vectors searched out | Column No. |
| breaker 2 | 4 |
| breaker 3 | 5 |
| ground disconnector 1 | 4 |
| ground disconnector 2 | 5 |

Based on row vectors and column vectors searched out, the possibly matching sub-matrix present in the incidence matrix of the topology substructure is determined. Based on principles of permutation and combination, column vectors have the following 6 possibilities: U1, U2, . . . U6; row vectors have the following 18 possibilities: W1, W2, . . . W18. Thereby, ultimately there could be 108 possibly matching sub-matrixes obtained: B1, B2, . . . B108. For the sake of brief description, only 3 of the possibilities, B1, B2 and B3, are given as examples. Others are omitted herein.

$$\text{Row vector } U1 = \begin{bmatrix} \text{Auxiliary bus segment 1} \\ \text{Auxiliary bus segment 2} \\ \text{Dummy point 3} \\ \text{Dummy point 4} \\ \text{Dummy point 5} \end{bmatrix}_{5*1}$$

$$\text{Row vector } U2 = \begin{bmatrix} \text{Main bus segment 1} \\ \text{Main bus segment 2} \\ \text{Dummy point 3} \\ \text{Dummy point 4} \\ \text{Dummy point 5} \end{bmatrix}_{5*1}$$

$$\text{Row vector } U3 = \begin{bmatrix} \text{Main bus segment 1} \\ \text{Auxiliary bus segment 1} \\ \text{Dummy point 3} \\ \text{Dummy point 4} \\ \text{Dummy point 5} \end{bmatrix}_{5*1}$$

$$\text{Row vector } U4 = \begin{bmatrix} \text{Main bus segment 1} \\ \text{Auxiliary bus segment 2} \\ \text{Dummy point 3} \\ \text{Dummy point 4} \\ \text{Dummy point 5} \end{bmatrix}_{5*1}$$

$$\text{Row vector } U5 = \begin{bmatrix} \text{Main bus segment 2} \\ \text{Auxiliary bus segment 1} \\ \text{Dummy point 3} \\ \text{Dummy point 4} \\ \text{Dummy point 5} \end{bmatrix}_{5*1}$$

$$\text{Row vector } U6 = \begin{bmatrix} \text{Main bus segment 2} \\ \text{Auxiliary bus segment 1} \\ \text{Dummy point 3} \\ \text{Dummy point 4} \\ \text{Dummy point 5} \end{bmatrix}_{5*1}$$

$$\text{Column vector } W1 = \begin{bmatrix} \text{Disconnector 1} \\ \text{Disconnector 2} \\ \text{Breaker 1} \\ \text{Ground disconnector 1} \\ \text{Ground disconnector 2} \end{bmatrix}^T_{5*1}$$

$$\text{Column vector } W2 = \begin{bmatrix} \text{Disconnector 2} \\ \text{Disconnector 3} \\ \text{Breaker 1} \\ \text{Ground disconnector 1} \\ \text{Ground disconnector 2} \end{bmatrix}^T_{5*1}$$

$$\text{Column vector } W3 = \begin{bmatrix} \text{Disconnector 3} \\ \text{Disconnector 4} \\ \text{Breaker 1} \\ \text{Ground disconnector 1} \\ \text{Ground disconnector 2} \end{bmatrix}^T_{5*1}$$

$$\text{Column vector } W4 = \begin{bmatrix} \text{Disconnector 1} \\ \text{Disconnector 4} \\ \text{Breaker 1} \\ \text{Ground disconnector 1} \\ \text{Ground disconnector 2} \end{bmatrix}^T_{5*1}$$

$$\text{Column vector } W5 = \begin{bmatrix} \text{Disconnector 1} \\ \text{Disconnector 3} \\ \text{Breaker 1} \\ \text{Ground disconnector 1} \\ \text{Ground disconnector 2} \end{bmatrix}^T_{5*1}$$

$$\text{Column vector } W6 = \begin{bmatrix} \text{Disconnector 2} \\ \text{Disconnector 4} \\ \text{Breaker 1} \\ \text{Ground disconnector 1} \\ \text{Ground disconnector 2} \end{bmatrix}^T_{5*1}$$

$$\text{Column vector } W7 = \begin{bmatrix} \text{Disconnector 1} \\ \text{Disconnector 3} \\ \text{Breaker 2} \\ \text{Ground disconnector 1} \\ \text{Ground disconnector 2} \end{bmatrix}^T_{5*1}$$

$$\text{Column vector } W8 = \begin{bmatrix} \text{Disconnector 1} \\ \text{Disconnector 4} \\ \text{Breaker 2} \\ \text{Ground disconnector 1} \\ \text{Ground disconnector 2} \end{bmatrix}^T_{5*1}$$

$$\text{Column vector } W9 = \begin{bmatrix} \text{Disconnector 2} \\ \text{Disconnector 3} \\ \text{Breaker 2} \\ \text{Ground disconnector 1} \\ \text{Ground disconnector 2} \end{bmatrix}^T_{5*1}$$

$$\text{Column vector } W10 = \begin{bmatrix} \text{Disconnector 2} \\ \text{Disconnector 4} \\ \text{Breaker 2} \\ \text{Ground disconnector 1} \\ \text{Ground disconnector 2} \end{bmatrix}_{5*1}^{T}$$

$$\text{Column vector } W11 = \begin{bmatrix} \text{Disconnector 3} \\ \text{Disconnector 4} \\ \text{Breaker 2} \\ \text{Ground disconnector 1} \\ \text{Ground disconnector 2} \end{bmatrix}_{5*1}^{T}$$

$$\text{Column vector } W12 = \begin{bmatrix} \text{Disconnector 1} \\ \text{Disconnector 2} \\ \text{Breaker 2} \\ \text{Ground disconnector 1} \\ \text{Ground disconnector 2} \end{bmatrix}_{5*1}^{T}$$

$$\text{Column vector } W13 = \begin{bmatrix} \text{Disconnector 1} \\ \text{Disconnector 3} \\ \text{Breaker 3} \\ \text{Ground disconnector 1} \\ \text{Ground disconnector 2} \end{bmatrix}_{5*1}^{T}$$

$$\text{Column vector } W14 = \begin{bmatrix} \text{Disconnector 1} \\ \text{Disconnector 2} \\ \text{Breaker 3} \\ \text{Ground disconnector 1} \\ \text{Ground disconnector 2} \end{bmatrix}_{5*1}^{T}$$

$$\text{Column vector } W15 = \begin{bmatrix} \text{Disconnector 1} \\ \text{Disconnector 4} \\ \text{Breaker 3} \\ \text{Ground disconnector 1} \\ \text{Ground disconnector 2} \end{bmatrix}_{5*1}^{T}$$

$$\text{Column vector } W16 = \begin{bmatrix} \text{Disconnector 2} \\ \text{Disconnector 3} \\ \text{Breaker 3} \\ \text{Ground disconnector 1} \\ \text{Ground disconnector 2} \end{bmatrix}_{5*1}^{T}$$

$$\text{Column vector } W17 = \begin{bmatrix} \text{Disconnector 3} \\ \text{Disconnector 4} \\ \text{Breaker 3} \\ \text{Ground disconnector 1} \\ \text{Ground disconnector 2} \end{bmatrix}_{5*1}^{T}$$

$$\text{Column vector } W18 = \begin{bmatrix} \text{Disconnector 2} \\ \text{Disconnector 4} \\ \text{Breaker 3} \\ \text{Ground disconnector 1} \\ \text{Ground disconnector 2} \end{bmatrix}_{5*1}^{T}$$

$$B1 = $$

$$U1 \times W1 = \begin{bmatrix} \text{Auxiliary bus segment 1} \\ \text{Auxiliary bus segment 2} \\ \text{Dummy point 3} \\ \text{Dummy point 4} \\ \text{Dummy point 5} \end{bmatrix}_{5*1} \begin{bmatrix} \text{Disconnector 1} \\ \text{Disconnector 2} \\ \text{Breaker 1} \\ \text{Ground disconnector 1} \\ \text{Ground disconnector 2} \end{bmatrix}_{5*1}^{T}$$

$$B2 = U1 \times W2 =$$

$$\begin{bmatrix} \text{Auxiliary bus segment 1} \\ \text{Auxiliary bus segment 2} \\ \text{Dummy point 3} \\ \text{Dummy point 4} \\ \text{Dummy point 5} \end{bmatrix}_{5*1} \begin{bmatrix} \text{Disconnector 2} \\ \text{Disconnector 3} \\ \text{Breaker 1} \\ \text{Ground disconnector 1} \\ \text{Ground disconnector 2} \end{bmatrix}_{5*1}^{T}$$

...

$$B72 =$$

$$U6 \times W18 = \begin{bmatrix} \text{Main bus segment 1} \\ \text{Auxiliary bus segment 2} \\ \text{Dummy point 3} \\ \text{Dummy point 4} \\ \text{Dummy point 5} \end{bmatrix}_{5*1} \begin{bmatrix} \text{Disconnector 2} \\ \text{Disconnector 4} \\ \text{Breaker 1} \\ \text{Ground disconnector 1} \\ \text{Ground disconnector 2} \end{bmatrix}_{5*1}^{T}$$

Tanking B1 as an example, according to method of generating incidence matrix, a sub-matrix B1 is obtained.

$$B1 = \begin{bmatrix} 1 & 0 & 0 & 0 & 0 \\ 0 & 1 & 0 & 0 & 0 \\ -1 & 0 & 1 & 1 & 0 \\ 0 & -1 & -1 & 0 & 1 \\ 0 & 0 & 0 & -1 & -1 \end{bmatrix}_{5*5}$$

The vector coordinates of the possibly matching sub-matrix are mapped with the vector coordinates of the incidence matrix of the topology substructure. Taking B1 as an example, the coordinates of vector $b_{ij}$ of B1 are mapped with the coordinates of vector $a_{ij}$ of the incidence matrix A of the topology substructure. By reference to the row vectors' table and column vectors' table, their mapping relations are recorded.

$(b_{11}, a_{11})$ $(b_{12}, a_{12})$ $(b_{13}, a_{13})(b_{14}, a_{14})(b_{15}, a_{15})$ $(b_{21}, a_{21})$ $(b_{22}, a_{22})$ $(b_{23}, a_{23})(b_{24}, a_{24})(b_{25}, a_{25})$ $(b_{31}, a_{31})$ $(b_{32}, a_{32})$ $(b_{33}, a_{33})(b_{34}, a_{34})(b_{35}, a_{35})$ $(b_{41}, a_{41})$ $(b_{42}, a_{42})$ $(b_{43}, a_{43})(b_{44}, a_{44})(b_{45}, a_{45})$ $(b_{51}, a_{51})$ $(b_{52}, a_{52})$ $(b_{53}, a_{53})(b_{54}, a_{54})(b_{55}, a_{55})$

The vector values of vector coordinates having mapping relations, such as the following values having mapping relations: $(b_{11}, a_{11})$, $b_{11}=1$, $a_{11}=1$, $b_{11}=a_{11}$; $(b_{12}, a_{12})$, $b_{12}=0$, $a_{12}=0$, $b_{12}=a_{12}$; ... $(b_{55}, a_{55})$, $b_{55}=-1$, $a_{55}=-1$, $b_{55}=a_{55}$ are compared one by one. It is determined therefrom that each vector value of the sub-matrix B1 is same as the vector value of the mapped vector value in the incidence matrix A. Then it is determined that the sub-structure B1 is a matching topology substructure.

Also taking B2 as an example, a substructure B2 is obtained by the method of generating incidence matrix described above.

$$B2 = \begin{bmatrix} 0 & 0 & 0 & 0 & 0 \\ 1 & 0 & 0 & 0 & 0 \\ 0 & 0 & 1 & 1 & 0 \\ -1 & 0 & -1 & 0 & 1 \\ 0 & 0 & 0 & -1 & -1 \end{bmatrix}_{5*5}$$

The coordinates of vector $b_{ij}$ of B2 are mapped with the coordinates of vector $a_{ij}$ of the incidence matrix A of the topology substructure. By reference to the row vectors' table and column vectors' table, their mapping relations are recorded.

($b_{12}$, $a_{11}$) ($b_{18}$, $a_{12}$) ($b_{13}$, $a_{13}$)($b_{14}$, $a_{14}$)($b_{15}$, $a_{15}$)
($b_{22}$, $a_{21}$) ($b_{28}$, $a_{22}$) ($b_{23}$, $a_{23}$)($b_{24}$, $a_{24}$)($b_{25}$, $a_{25}$)
($b_{32}$, $a_{31}$) ($b_{38}$, $a_{32}$) ($b_{33}$, $a_{33}$)($b_{34}$, $a_{34}$)($b_{35}$, $a_{35}$)
($b_{42}$, $a_{41}$) ($b_{48}$, $a_{42}$) ($b_{43}$, $a_{43}$)($b_{44}$, $a_{44}$)($b_{45}$, $a_{45}$)
($b_{52}$, $a_{51}$) ($b_{58}$, $a_{52}$) ($b_{53}$, $a_{53}$)($b_{54}$, $a_{54}$)($b_{55}$, $a_{55}$)

The vector values of vector coordinates having mapping relations are compared one by one. For example, if the following values having mapping relations ($b_{12}$, $a_{11}$), $b_{12}$=0, $a_{11}$=1, $b_{12}$ and $a_{11}$ are not equal, it is determined therefrom that sub-matrix B2 is not a matching topology substructure.

Then, the remaining possibly matching sub-matrixes are traversed. It is finally filtered out that only B1 is a matching topology substructure. The section surrounded by a black frame in the following incidence matrix A″ is the matching sub-matrix B1.

$$\text{Incidence Matrix } A'' = \begin{bmatrix} 1 & 0 & 0 & 0 & 0 & 1 & 0 & 0 & 0 \\ 0 & 1 & 0 & 0 & 0 & 0 & 1 & 0 & 0 \\ -1 & 0 & 1 & 1 & 0 & 0 & 0 & 0 & 0 \\ 0 & -1 & -1 & 0 & 1 & 0 & 0 & 0 & 0 \\ 0 & 0 & 0 & -1 & -1 & 0 & 0 & 0 & 0 \\ 0 & 0 & 0 & 0 & 0 & 0 & -1 & 1 & 0 \\ 0 & 0 & 0 & 0 & 0 & -1 & 0 & 0 & 1 \\ 0 & 0 & 0 & 0 & 0 & 0 & 0 & -1 & 0 \\ 0 & 0 & 0 & 0 & 0 & 0 & 0 & 0 & -1 \end{bmatrix}_{9*9}$$

In step S105, a fourth incidence matrix is obtained by using the second incidence matrix to transform the matching sub-matrix, in which the fourth incidence matrix corresponds to the incidence matrix of the skeleton topology structure of the primary topology structure.

In step S106, a skeleton topology structure corresponding to the primary topology structure is generated according to the fourth incidence matrix.

According to an embodiment of this invention, obtaining the fourth incidence matrix by using the second incidence matrix to transform the matching sub-matrix comprises: replacing the matching sub-matrix with the second incidence matrix to obtain the fourth incidence matrix; then generating the skeleton topology structure corresponding to the primary topology structure according to the fourth incidence matrix.

Figure 11:
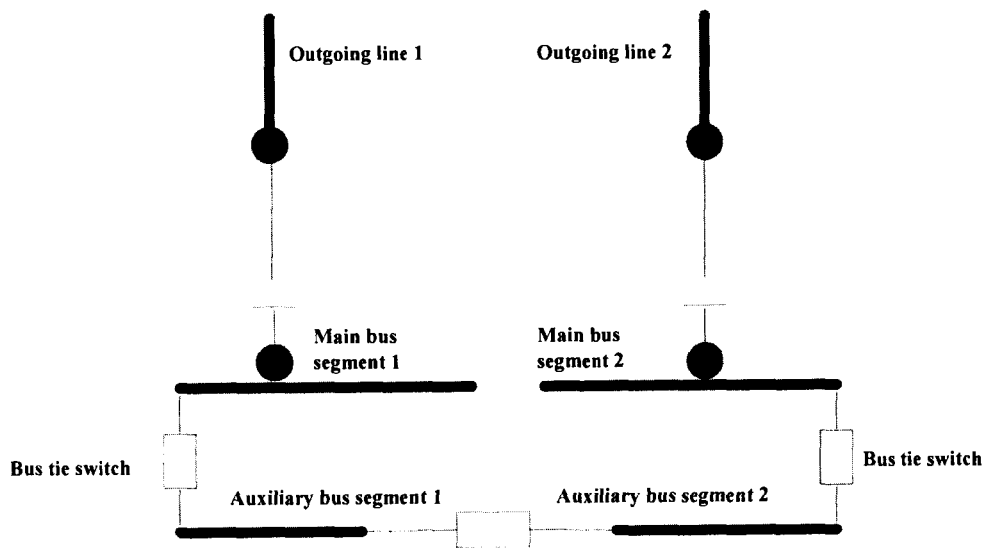
FIG. 11 shows a skeleton topology structure corresponding to the primary topology structure, according to an embodiment of this invention.

According to the above embodiment of this invention, a incidence matrix B of skeleton topology structure corresponding to the primary topology structure is generated by replacing the matching sub-matrix B1 with the incidence matrix A' of the skeleton topology structure. The skeleton topology structure as shown in FIG. 11 corresponding to the primary topology structure is generated according to the incidence matrix B of the skeleton topology structure corresponding to the primary topology structure.

$$\text{Incidence Matrix } A'' = \begin{bmatrix} 0 & 0 & -1 & 0 & 0 & 1 & 0 & 0 & 0 \\ 0 & 0 & 0 & 0 & 0 & 0 & 1 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & -1 & -1 & 0 & 0 & 0 & 0 \\ 0 & 0 & 0 & 0 & 0 & 0 & -1 & 1 & 0 \\ 0 & 0 & 0 & 0 & 0 & -1 & 0 & 0 & 1 \\ 0 & 0 & 0 & 0 & 0 & 0 & 0 & -1 & 0 \\ 0 & 0 & 0 & 0 & 0 & 0 & 0 & 0 & -1 \end{bmatrix}_{9*9}$$

According to another embodiment of this invention, generating a fourth incidence matrix by using the second incidence matrix to transform the matching sub-matrix comprises the steps of: determining a transformation matrix according to the first incidence matrix and second incidence matrix; obtaining a fourth incidence matrix by using the transformation matrix to transform the matching sub-matrix; generating a skeleton topology structure corresponding to the primary topology structure according to the fourth incidence matrix.

According to the above embodiment of this invention, taking incidence matrixes A and A' computed in Step S102 as an example, the transformation matrix is determined according to the incidence matrix of the topology substructure and the incidence matrix of the skeleton topology substructure. The relation among the incidence matrix of the topology substructure, the incidence matrix of the skeleton topology substructure and the transformation matrix of the skeleton topology substructure is A×H=A'. Based on knowledge of matrix conversion, a transformation matrix is obtained with H=$A^{-1}$×A'. By using the formulation H=$A^{-1}$×A', the transformation matrix H is obtained. The incidence matrix corresponding to primary topology structure and skeleton topology structure is generated by using the transformation matrix H and matching sub-matrix B1. By using formulation B1×H=A', B1 is transformed into A', and incidence matrix B of skeleton topology structure corresponding to the primary topology structure is generated.

$$\text{Transformation matrix } H = \begin{bmatrix} 0 & 0 & 1 & 0 & 0 \\ 0 & 0 & -1 & 0 & 0 \\ 0 & 0 & 1 & 0 & 0 \\ 0 & 0 & 0 & 0 & 0 \\ 0 & 0 & 0 & 0 & 0 \end{bmatrix}_{5*5}$$

$$A' = B1 \times H = \begin{bmatrix} 1 & 0 & 0 & 0 & 0 \\ 0 & 1 & 0 & 0 & 0 \\ -1 & 0 & 1 & 1 & 0 \\ 0 & -1 & -1 & 0 & 1 \\ 0 & 0 & 0 & -1 & -1 \end{bmatrix}_{5*5} \begin{bmatrix} 0 & 0 & 1 & 0 & 0 \\ 0 & 0 & -1 & 0 & 0 \\ 0 & 0 & 1 & 0 & 0 \\ 0 & 0 & 0 & 0 & 0 \\ 0 & 0 & 0 & 0 & 0 \end{bmatrix}_{5*5}$$

-continued $$\text{Transformation matrix } A'' = \begin{bmatrix} 1 & 0 & 0 & 0 & 0 & 1 & 0 & 0 & 0 \\ 0 & 1 & 0 & 0 & 0 & 0 & 1 & 0 & 0 \\ -1 & 0 & 1 & 1 & 0 & 0 & 0 & 0 & 0 \\ 0 & -1 & -1 & 0 & 1 & 0 & 0 & 0 & 0 \\ 0 & 0 & 0 & -1 & -1 & 0 & 0 & 0 & 0 \\ 0 & 0 & 0 & 0 & 0 & 0 & -1 & 1 & 0 \\ 0 & 0 & 0 & 0 & 0 & -1 & 0 & 0 & 1 \\ 0 & 0 & 0 & 0 & 0 & 0 & 0 & -1 & 0 \\ 0 & 0 & 0 & 0 & 0 & 0 & 0 & 0 & -1 \end{bmatrix}_{9*9}$$

Figure 12:
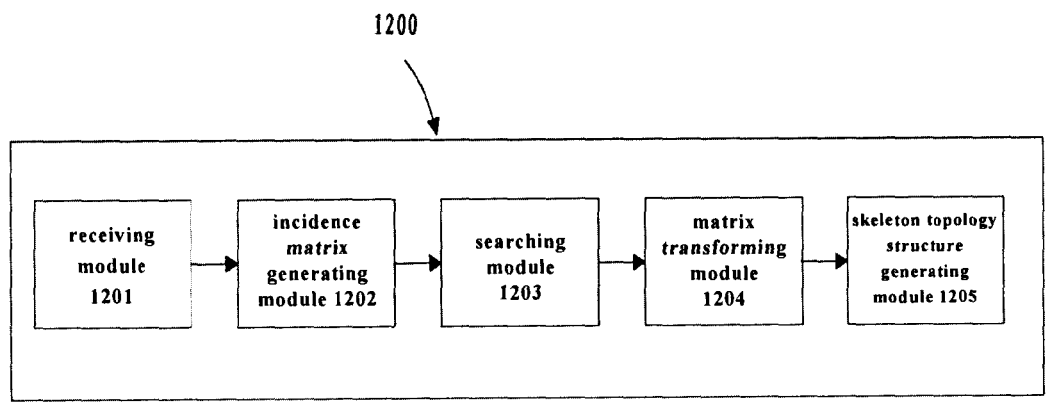
FIG. 12 shows a block diagram of the device for extracting skeleton topology in an electric power grid, according to an embodiment of this invention.

Based on the same inventive concept, this invention provides a device for extracting skeleton topology of electric power grid. FIG. 12 shows a block diagram of the device for extracting skeleton topology in an electric power grid, according to an embodiment of this invention. The device comprises: a receiving module 1201 configured to receive a description of a topology sub-structure corresponding with user's need and a description of skeleton topology sub-structure extracted from the topology sub-structure; an incidence matrix generating module 1202 configured to generate a first incidence matrix based on the description of the topology sub-structure, to generate a second incidence matrix based on the description of the skeleton topology sub-structure, and to generate a third incidence matrix based on a primary topology structure of the electric power grid; a searching module 1203 configured to search from the third incidence matrix a sub-matrix that matches the first incidence matrix; a matrix transforming module 1204 configured to obtain a fourth incidence matrix by using the second incidence matrix to transform the matching sub-matrix; and a skeleton topology structure generating module 1205 configured to generate the skeleton topology structure corresponding to the primary topology structure according to the fourth incidence matrix.

According to an embodiment of this invention, the matrix transforming module 1204 is further configured to: generate a fourth incidence matrix by using the second incidence matrix to replace the matching sub-matrix.

According to an embodiment of this invention, the matrix transforming module 1204 is further configured to: determine the transformation matrix according to the first incidence matrix and second incidence matrix; and obtain a fourth incidence matrix by using the transformation matrix to transform the matching sub-matrix.

According to an embodiment of this invention, the searching module 1203 further comprises: a vector searching module, being configured to search the row vectors and column vectors of the first incidence matrix from the row vectors and column vectors of the third incidence matrix respectively; a sub-matrix determining module, being configured to determine that possibly matching sub-matrix is contained in the third incidence matrix if all the row vectors and column vectors of the first incidence matrix are searched out from the row vectors and column vectors of the third incidence matrix; a sub-matrix filtering module, being configured to filter out the sub-matrix matching the first incidence matrix from the possibly matching sub-matrixes contained in the third incidence matrix.

According to an embodiment of this invention, the vector searching module is further configured to: search the row vectors of the first incidence matrix one by one from the row vectors of the third incidence matrix; add the row vectors searched out into the row vectors' list, and record the row number of the row vectors in the third incidence matrix; search the column vectors of the first incidence matrix from the column vectors of the third incidence matrix if it is determined that the row vectors' list includes all row vectors in the first incidence matrix; add the column vectors searched out into the column vectors' list, and record the column number of the column vectors in the third incidence matrix; judge whether the column vectors' list includes all column vectors in the first incidence matrix;

According to an embodiment of this invention, the sub-matrix determining module is further configured to: by reference to the row vectors and column vectors of the incidence matrix of a topology substructure, permutate and combine the row vectors and column vectors searched out to determine possibly matching sub-matrix contained in the third incidence matrix.

According to an embodiment of this invention, the sub-matrix filtering module is further configured to: map the vector coordinates of the possibly matching sub-matrix with the vector coordinates of the first incidence matrix; to compare the vector values of the vector coordinates of the possibly matching sub-matrix with the vector values of the vector coordinates of the first incidence matrix having mapping relations; if the vector value of each vector coordinate of the possibly matching sub-matrix is same as the vector value of vector coordinates of the first incidence matrix having mapping relations, to filter out the sub-matrix matching the first incidence matrix from the possibly matching sub-matrixes.

The method and device for extracting skeleton topology structure according to this invention can automatically and efficiently extract skeleton topology structures according to business needs. Thus, the frequent occurrence of collisions caused by different frequencies in updating skeleton topology structures by various business departments can be avoided.

Figure 13:
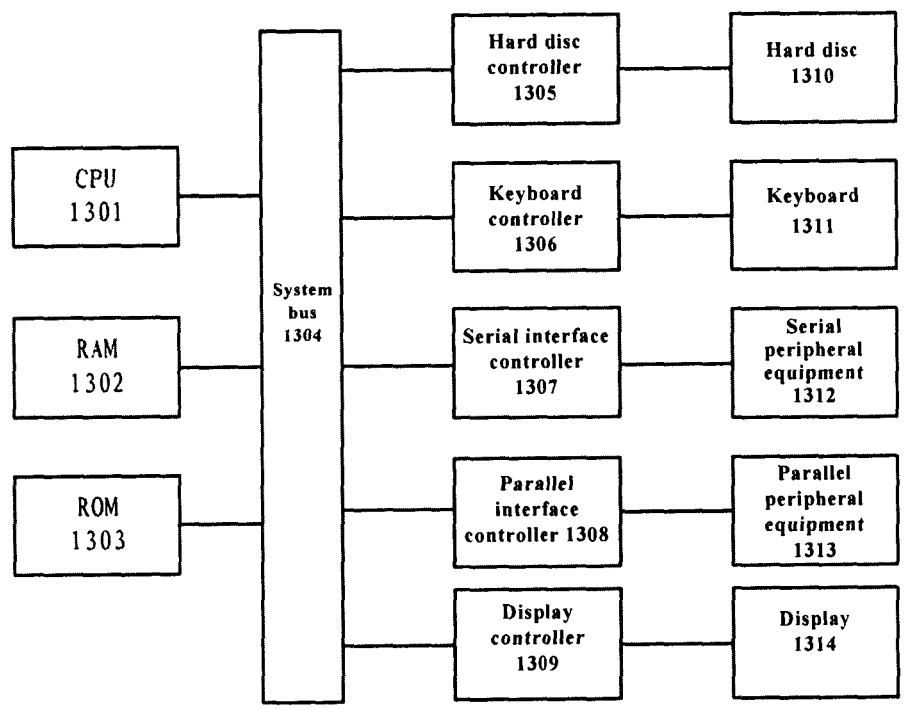
FIG. 13 is a schematic block diagram of the structure of the computing devices capable of implementing the embodiments of this invention.

FIG. 13 is a schematic block diagram of the structure of the computing devices for implementing the embodiments of this invention. The computer system in FIG. 13 comprises CPU (central processing unit) 1301, RAM (random access memory) 1302, ROM (read-only memory) 1303, system bus 1304, hard disc controller 1305, keyboard controller 1306, serial interface controller 1307, parallel interface controller 1308, display controller 1309, hard disc 1310, keyboard 1311, serial peripheral equipment 1312, parallel peripheral equipment 1313 and display 1314. Among these components, the CPU 1301, RAM 1302, ROM 1303, hard disc controller 1305, keyboard controller 1306, serial interface controller 1307, parallel interface controller 1308, display controller 1309 are connected to system bus 1304; hard disc 1310 is connected to hard disc controller 1305; keyboard 1311 is connected to keyboard controller 1306; serial peripheral equipment 1312 is connected to serial interface controller 1307; parallel peripheral equipment 1313 is connected to parallel interface controller 1308; and display 1314 is connected to display controller 1309.

The function of each component in FIG. 13 is well known in this field, and the structure in FIG. 13 is conventional. Such a structure is not only used in PC, but also in handhold devices such as Palm PC, PDA (personal digital assistant), mobile phones. In different appliances, such as in realizing the user terminal containing the user module according to this invention or the host server containing the network application servers according to this invention, some components can be added to the structure shown in FIG. 13, or some components in FIG. 13 can be omitted. The system shown in FIG. 13 is controlled by computer readable instructions, generally stored in hard disc 1310, EPROM or other nonvolatile memories as software. The software can also be downloaded from internet (not indicated in the drawing). The software stored in hard disc 1310 or downloaded from internet can be loaded in RAM 1302 and executed by CPU 1301, so as to carry out functions defined by the software.

Although the computer system described in FIG. 13 can support the technical solution provided according to this invention, it is just an example of a computer system. Those skilled in the art will appreciate that embodiments of this invention can also be realized with many other designs of computer systems.

The exemplarily embodiments of the present invention have been described by reference to the attached drawings, but it should be understood that this invention is not limited to these exact embodiments, and those of ordinary skill in the art can make modifications and variations without departing from the scope and spirit of the invention. All these modifications and variations are intended to be included within the scope of this invention defined by the attached claims.

It should be understood that at least some aspects of this invention can be alternatively implemented as program products. Programs defining functions relating to this invention can be transmitted to data storage device or computer devices through various signal bearing media. The signal bearing media include but not limit to read only medium (such as CD-ROM), writable storage medium (such as floppy disc and hard disc driver, read/write CD ROM, optical medium) as well as communication media like computers having ethernet and telephone networks. Thereby, it should be understood that among these signal bearing media, when they carry or coded with the computer readable instructions managing the methodology functions of this invention, they represent alternative embodiments of this invention. This invention can be realized in forms of hardware, software, firmware or their combinations. This invention can be realized on one computer device in a centralized manner, or be realized in a dispersed manner. With the dispersed manner, different components are dispersed on a number of inter-connected computer devices. Any computer devices or other devices that are suitable for executing the methods described herein are appropriate. Preferably, this invention is carried out in a form of combination of computer software and general purpose computer hardware. In this way of realizing the invention, when the computer program is loaded and executed, the computer device is controlled to execute the method of this invention or constitute the system of this invention.

The above description is intended to describe with examples the preferred embodiment of this invention. The above descriptions of preferred embodiments are not exhaustive, neither it is intended to limited to the invention in the definite form disclosed. In view of this teaching, many modifications and variations are possible. These modifications and variations are apparent for those skilled in the art, and are within the scope of this invention defined by the attached claims.

What is claimed is:

1. A computer-implemented method for extracting a skeleton topology for an electric power grid, comprising:

providing, by one or more processors of a computer, a primary topology structure of the electric power grid to a user via a graphic interface of the computer;

receiving, by the one or more processors via an editing tool of the graphic interface that is operable by the user, a selection of a selected topology substructure from the primary topology structure and a skeleton topology substructure extracted from the selected topology substructure;

generating, by the one or more processors, a first incidence matrix based on the selected topology substructure, the first incidence matrix indicating connections between nodes representing electrical components within the selected topology substructure, the first incidence matrix indicating inflow and outflow of each connection of each node;

generating, by the one or more processors, a second incidence matrix based on the skeleton topology substructure, the second incidence matrix indicating connections between nodes representing electrical components within the skeleton topology substructure, the second incidence matrix indicating inflow and outflow of each connection of each node;

generating, by the one or more processors, a third incidence matrix based on the primary topology structure, the third incidence matrix indicating connections between nodes representing electrical components within the primary topology structure, the third incidence matrix indicating inflow and outflow of each connection of each node;

searching, by the one or more processors, from the third incidence matrix a sub-matrix that matches the first incidence matrix, the sub-matrix indicating connections between nodes representing electrical components within the selected topology substructure, the sub-matrix indicating inflow and outflow of each connection of each node;

obtaining, by the one or more processors, a fourth incidence matrix by using the second incidence matrix to transform the sub-matrix, the fourth incidence matrix indicating connections between nodes representing electrical components within a skeleton topology structure, the fourth incidence matrix indicating inflow and outflow of each connection of each node; and generating, by the one or more processors, the skeleton topology structure extracted from the selected topology substructure based on the fourth incidence matrix, the skeleton topology structure enabling the user to control effectiveness of the electrical power grid.

2. The computer-implemented method according to claim 1, wherein obtaining the fourth incidence matrix by using the second incidence matrix to transform the sub-matrix comprises:

replacing, by the one or more processors, the sub-matrix with the second incidence matrix to generate the fourth incidence matrix.

3. The computer-implemented method according to claim 1, wherein obtaining a fourth incidence matrix by using the second incidence matrix to transform the sub-matrix comprises:

determining, by the one or more processors, a transformation matrix according to the first incidence matrix and the second incidence matrix;

obtaining, by the one or more processors, the fourth incidence matrix by using the transformation matrix to transform the sub-matrix.

4. The computer-implemented method according to claim 1, wherein searching from the third incidence matrix a submatrix that matches the first incidence matrix comprises:

searching, by the one or more processors, row vectors and column vectors of the first incidence matrix from row vectors and column vectors of the third incidence matrix respectively;

when all row vectors and column vectors of the first incidence matrix are searched out from the row vectors and column vectors of the third incidence matrix, determining, by the one or more processors, a possibly matching submatrix contained in the third incidence matrix based on the row vectors and column vectors searched out; and filtering out, by the one or more processors, the sub-matrix that matches the first incidence matrix from the possibly matching sub-matrix contained in the third incidence matrix.

5. The computer-implemented method according to claim 4, wherein searching row vectors and column vectors of the first incidence matrix from row vectors and column vectors of the third incidence matrix respectively comprises:

searching, by the one or more processors, the row vectors of the first incidence matrix one by one from the row vectors of the third incidence matrix;

adding, by the one or more processors, the row vectors searched out into a row vectors' list, and recording a row number for each of the row vectors searched out in the third incidence matrix;

when determining that the row vectors' list includes all row vectors in the first incidence matrix, searching, by the one or more processors, the column vectors of the first incidence matrix from the column vectors of the third incidence matrix one by one;

adding, by the one or more processors, the column vectors searched out into a column vectors' list, and recording a column number for each of the column vectors in the third incidence matrix; and judging, by the one or more processors, whether the column vectors' list includes all column vectors in the first incidence matrix.

6. The computer-implemented method according to claim 4, wherein determining the possibly matching sub-matrix contained in the third incidence matrix based on the row vectors and column vectors searched out comprises:

determining, by the one or more processors, the possibly matching submatrix contained in the third incidence matrix by permutating and combining the row vectors and column vectors searched out by reference to the row vectors and column vectors of the first incidence matrix.

7. The computer-implemented method according to claim 6, wherein filtering out the sub-matrix matching the first incidence matrix from the possibly matching sub-matrix contained in the third incidence matrix comprises:

mapping, by the one or more processors, vector coordinates of the possibly matching sub-matrix with vector coordinates of the first incidence matrix;

comparing, by the one or more processors, vector values of the vector coordinates of the possibly matching sub-matrix with vector values of the vector coordinates of the first incidence matrix having mapping relations; and when the vector value of each vector coordinate of the possibly matching sub-matrix is same as the vector value of vector coordinates of the first incidence matrix having mapping relations, filtering out, by the one or more processors, the sub-matrix matching the first incidence matrix from the possibly matching sub-matrix.

8. A device for extracting a skeleton topology for an electric power grid, comprising:

one or more processors; and a memory, coupled to the one or more processors, the memory storing processor-executable program instructions, wherein the one or more processors, when executing the program instructions, are configured to:

provide a primary topology structure of the electric power grid to a user via a graphic interface of the device;

receive via an editing tool of the graphic interface that is operable by the user a selection of a selected topology substructure from the primary topology structure and a skeleton topology substructure extracted from the selected topology substructure;

generate a first incidence matrix based on the selected topology substructure, the first incidence matrix indicating connections between nodes representing electrical components within the selected topology substructure, the first incidence matrix indicating inflow and outflow of each connection of each node;

generate a second incidence matrix based on the skeleton topology substructure, the second incidence matrix indicating connections between nodes representing electrical components within the skeleton topology substructure, the second incidence matrix indicating inflow and outflow of each connection of each node;

generate a third incidence matrix based on the primary topology structure, the third incidence matrix indicating connections between nodes representing electrical components within the primary topology structure, the third incidence matrix indicating inflow and outflow of each connection of each node;

search from the third incidence matrix a sub-matrix that matches the first incidence matrix, the sub-matrix indicating connections between nodes representing electrical components within the selected topology substructure, the sub-matrix indicating inflow and output of each connection of each node;

obtain a fourth incidence matrix by using the second incidence matrix to transform the sub-matrix, the fourth incidence matrix indicating connections between nodes representing electrical components within a skeleton topology structure, the fourth incidence matrix indicating inflow and outflow of each connection of each node; and generate the skeleton topology extracted from the selected topology substructure based on the fourth incidence matrix, the skeleton topology enabling the user to control effectiveness of the electrical power grid.

9. The device according to claim 8, wherein to obtain the fourth incidence matrix, the one or more processors are further configured to:

generate the fourth incidence matrix by using the second incidence matrix to replace the sub-matrix.

10. The device according to claim 8, wherein to obtain a fourth incidence matrix, the one or more processors are further configured to:

determine a transformation matrix according to the first incidence matrix and the second incidence matrix; and obtain the fourth incidence matrix by using the transformation matrix to transform the sub-matrix.

11. The device according to claim 8, wherein to search from the third incidence matrix a sub-matrix, the one or more processors are further configured to:

search row vectors and column vectors of the first incidence matrix from row vectors and column vectors of the third incidence matrix respectively;

determine a possibly matching sub-matrix contained in the third incidence matrix when all the row vectors and column vectors of the first incidence matrix are searched out from the row vectors and column vectors of the third incidence matrix; and filter out the sub-matrix matching that matches the first incidence matrix from the possibly matching sub-matrix contained in the third incidence matrix.

12. The device according to claim 11, wherein to search the row vectors and column vectors of the first incidence matrix, the one or more processors are further configured to:

search the row vectors of the first incidence matrix one by one from the row vectors of the third incidence matrix;

add the row vectors searched out into a row vectors' list, and record a row number for each of the row vectors searched out in the third incidence matrix;

when determining that the row vectors' list includes all row vectors in the first incidence matrix, search column vectors of the first incidence matrix one by one from the column vectors of the third incidence matrix;

add the column vectors searched out into a column vectors' list, and record a column number for each of the column vectors in the third incidence matrix; and judge whether the column vectors' list includes all column vectors of the first incidence matrix.

13. The device according to claim 11, wherein to determine a possibly matching sub-matrix contained in the third incidence matrix, the one or more processors are further configured to:

determine the possibly matching sub-matrix contained in the third incidence matrix by permutating and combining the row vectors and column vectors searched out by reference to the row vectors and column vectors of the first incidence matrix.

14. The device according to claim 13, wherein to filter out the sub-matrix matching the first incidence matrix from the possibly matching sub-matrix, the one or more processors are further configured to:

map vector coordinates of the possibly matching sub-matrix with vector coordinates of the first incidence matrix;

compare vector values of the vector coordinates of the possibly matching sub-matrix with vector values of the vector coordinates of the first incidence matrix having mapping relations; and when the vector value or each vector coordinate of the possibly matching sub-matrix is same as the vector value of vector coordinates of the first incidence matrix having mapping relations, filter out the sub-matrix matching the first incidence matrix from the possibly matching submatrix.

15. A computer program product comprising a non-transitory computer-readable storage medium having computer readable program instructions embodied therewith, the computer readable program instructions executed by one or more processors to cause a computer to perform a method for extracting a skeleton topology for an electric power grid, said method comprising:

providing, by the one or more processors of the computer, a primary topology structure of the electric power grid to a user via a graphic interface of the computer;

receiving, by the one or more processors via an editing tool of the graphic interface that is operable by the user, a selection of a selected topology substructure from the primary topology structure and a skeleton topology substructure extracted from the selected topology substructure;

generating, by the one or more processors, a first incidence matrix based on the topology substructure, the first incidence matrix indicating connections between nodes representing electrical components within the topology substructure, the first incidence matrix indicating inflow and outflow of each connection of each node;

generating, by the one or more processors, a second incidence matrix based on the skeleton topology substructure, the second incidence matrix indicating connections between nodes representing electrical components within the skeleton topology substructure, the second incidence matrix indicting inflow and outflow of each connection of each node;

generating, by the one or more processors, a third incidence matrix based on the primary topology structure, the third incidence matrix indicating connections between nodes representing electrical components within the primary topology structure, the third incidence matrix indicating inflow and outflow of each connection of each node;

searching, by the one or more processors, from the third incidence matrix a sub-matrix that matches the first incidence matrix, the sub-matrix indicating connections between nodes representing electrical components within the selected topology substructure, the sub-matrix indicating inflow and outflow of each connection of each node;

obtaining, by the one or more processors, a fourth incidence matrix by using the second incidence matrix to transform the sub-matrix, the fourth incidence matrix indicating connections between nodes representing electrical components within a skeleton topology structure, the fourth incidence matrix indicating inflow and outflow of each connection of each node; and generating, by the one or more processors, the skeleton topology structure extracted from the selected topology substructure based on the fourth incidence matrix, the skeleton topology structure enabling the user to control effectiveness of the electrical power grid.

* * * * *